(12) United States Patent
Lostoski

(10) Patent No.: US 8,780,563 B2
(45) Date of Patent: Jul. 15, 2014

(54) LOAD DISTRIBUTED HEAT SINK SYSTEM

(75) Inventor: Douglas Alan Lostoski, Richfield, OH (US)

(73) Assignee: Rockwell Automation Technologies, Inc., Mayfield Heights, OH (US)

(*) Notice: Subject to any disclaimer, the term of this patent is extended or adjusted under 35 U.S.C. 154(b) by 221 days.

(21) Appl. No.: 13/323,446

(22) Filed: Dec. 12, 2011

(65) Prior Publication Data

US 2013/0148306 A1    Jun. 13, 2013

(51) Int. Cl.
*H05K 7/20* (2006.01)

(52) U.S. Cl.
USPC ...... 361/720; 361/679.54; 361/704; 361/719; 165/80.2; 165/80.3; 257/718; 257/719

(58) Field of Classification Search
USPC ............. 361/679.46, 679.54, 704–712, 361/715–727; 165/80.2–80.5, 104.33, 185; 257/707–713, 718–727; 174/15.1, 174/15.2, 16.3, 252; 29/842, 854, 592.1
See application file for complete search history.

(56) References Cited

U.S. PATENT DOCUMENTS

| | | | |
|---|---|---|---|
| 5,699,609 A | 12/1997 | Wieloch | |
| 5,847,928 A * | 12/1998 | Hinshaw et al. | 361/704 |
| 5,920,120 A * | 7/1999 | Webb et al. | 257/719 |
| 6,125,037 A * | 9/2000 | Bollesen | 361/704 |
| 6,243,264 B1 * | 6/2001 | Bollesen et al. | 361/704 |
| 6,249,436 B1 * | 6/2001 | Bollesen | 361/720 |
| 8,270,157 B2 * | 9/2012 | Hongo | 361/679.54 |

* cited by examiner

*Primary Examiner* — Michail V Datskovskiy
(74) *Attorney, Agent, or Firm* — Fletcher Yoder, P.C.

(57) ABSTRACT

The invention provides a load distributed heat sink system for securing a heat sink to a heat-generating electronic component while distributing the load on the circuit board. Provided is a heat sink system having heat sink, a heat sink clip, and a circuit board. The heat sink is generally disposed on one side of the circuit board over a component, and the heat sink clip is generally disposed on the opposing side of the circuit board. The ends of heat sink clip reach to the other side and attach onto the heat sink on. The heat sink clip further includes a load spreader, which is urged onto the circuit board by the heat sink clip, both retaining the heat sink system in place and distributing load on the circuit board.

20 Claims, 3 Drawing Sheets

LOAD DISTRIBUTED HEAT SINK SYSTEM

BACKGROUND

The invention relates generally to heat sink systems. More specifically, the invention relates heat sink attachment systems.

Heat sinks are commonly attached to heat-generating components on circuit boards to help dissipate heat more effectively. These components include various processors, digital circuits, power electronic switching devices, and so forth, that generate heat during operation. Heat sinks effectively transfer heat from these components to the air, or other surrounding medium. As heat sinks are designed to provide a much larger air-contacting surface area than the component, the component is able to more effectively dissipate heat when thermally coupled to a heat sink. This helps to prevent overheating of components, which may cause system malfunction and possible eventual failure.

Heat sinks can be attached to components and circuit boards through several methods, such as adhesive methods and mechanical methods. Adhesives include thermal tapes, glues, and epoxy, and are appropriate for less massive heat sinks and for use with components with lower power dissipation. Conversely, mechanical attachment methods are more common for heftier heat sinks and components with higher power dissipation.

Mechanical methods of attaching heat sinks generally involve securing a heat sink directly to a component or circuit board to be cooled. This is typically done by either screwing the heat sink onto the component or circuit board or clamping the heat sink onto the circuit board. In the case of circuit boards or thinner components, these attachment methods can impart uneven pressure and bend the circuit board, causing damage to solder joints. Damaged solder joints adversely affect the integrity of the circuit, which can cause problems from operational errors to whole system failures.

There is need for a means to mechanically attach heat sinks to heat-generating components and circuit boards so that the heat sink is in sturdy contact with the component while evenly distributing pressure, preserving the physical integrity of the circuit board and solder joints connecting to other components.

BRIEF DESCRIPTION

In an exemplary embodiment, a load distributed heat sink system includes a circuit board comprising an electronic circuit to be cooled disposed on a first side of the circuit board with a heat sink disposed adjacent to the electronic circuit and thermally coupled to the electronic circuit to extract heat from the electronic circuit during operation. The system also includes a clip disposed on a second side of the circuit board opposite the first side, which contacts the heat sink to retain the heat sink in place adjacent to the electronic circuit. There is a load spreader disposed adjacent to the clip, in which the clip urges the load spreader towards the second side of the circuit board to create a force to retain the heat sink in place adjacent to the electronic circuit.

In another embodiment, a heat sink system includes a heat sink configured to be disposed adjacent to an electronic circuit disposed on a circuit board and configured to be thermally coupled to an electronic circuit to extract heat from the electronic circuit during operation. The system also includes a clip configured to be disposed on a second side of the circuit board opposite the first side, in which the clip is configured to contact the heat sink to retain the heat sink in place adjacent to the electronic circuit. There is also a load spreader configured to be disposed adjacent to the clip, so that when installed, the clip urges the load spreader towards the second side of the circuit board to create a force to retain the heat sink in place adjacent to the electronic circuit.

In another embodiment, a heat sink system includes a clip configured to be disposed on a second side of a circuit board opposite from a first side on which a electronic circuit is disposed that is to be cooled, in which the clip is configured to contact a heat sink disposed adjacent to the electronic circuit to retain the heat sink in place adjacent to the electronic circuit. There is also a load spreader configured to be disposed adjacent to the clip, such that when installed, the clip urges the load spreader towards the second side of the circuit board to create a force to retain the heat sink in place adjacent to the electronic circuit.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
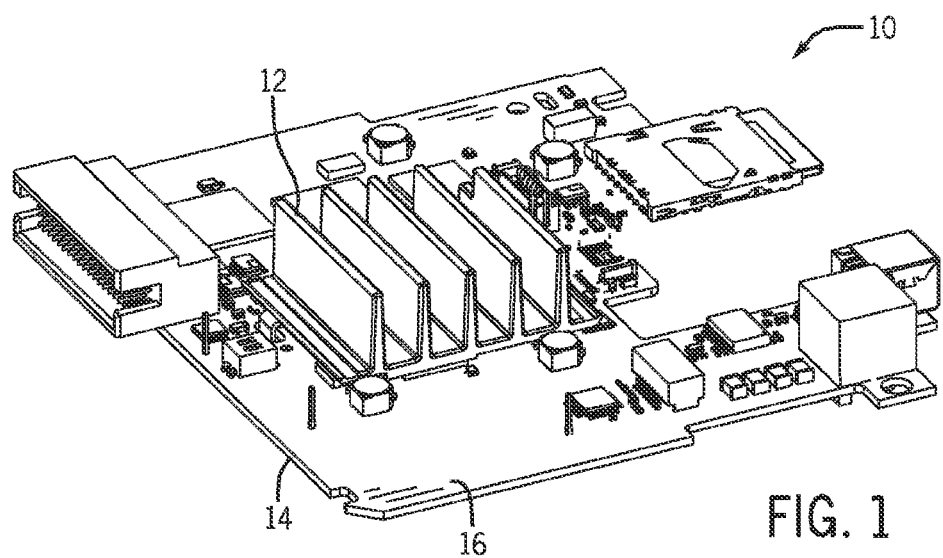
FIG. 1 is an exemplary perspective view of a load distributed heat sink system in use.

FIG. 1 shows one embodiment of a load distributed heat sink system, designated generally here as a heat sink assembly 10. The heat sink assembly 10 comprises a heat sink 12, an electronic circuit board 14, wherein the heat sink 12 is usually situated in contact with a heat-generating component on a first side 16 of the electronic circuit board 14, and a heat sink clip assembly 18 (visible in FIG. 2). The heat sink 12 shown in FIG. 1 is one example of a variety of heat sinks that may be used with the heat sink assembly 10. One purpose of one or more embodiments of the heat sink assembly 10 is generally to attach a heat sink to an electronic circuit board without imparting potentially harmful pressure on the electronic circuit board. The electronic circuit board 14 of the heat sink assembly 10 is generally made from fiberglass or any conventional fiber-reinforced resin, and may comprise a plurality of various electronic components. The electronic circuit board 14 may be configured to carry out any desired function, and the invention is not intended to be limited to any particular circuit configuration or operation. Thus, applications of the heat sink assembly 10 may span a wide range of industries and applications.

Figure 2:
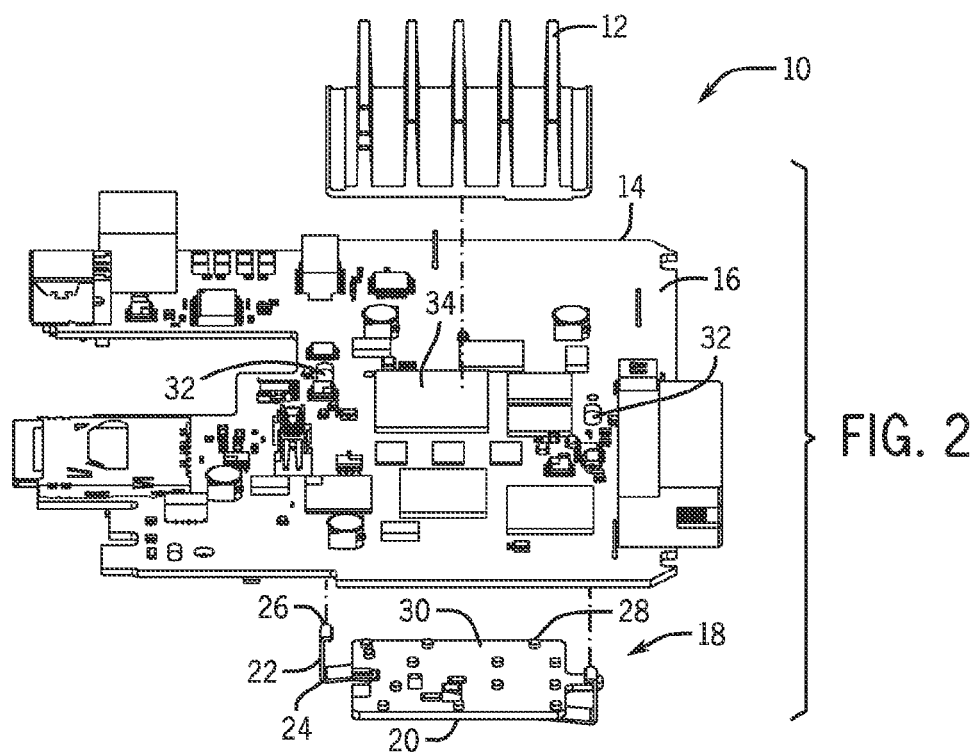
FIG. 2 is an exploded perspective view of a load distributed heat sink system showing a first side of an electronic circuit board and a first side of a load distribution plate.
Figure 3:
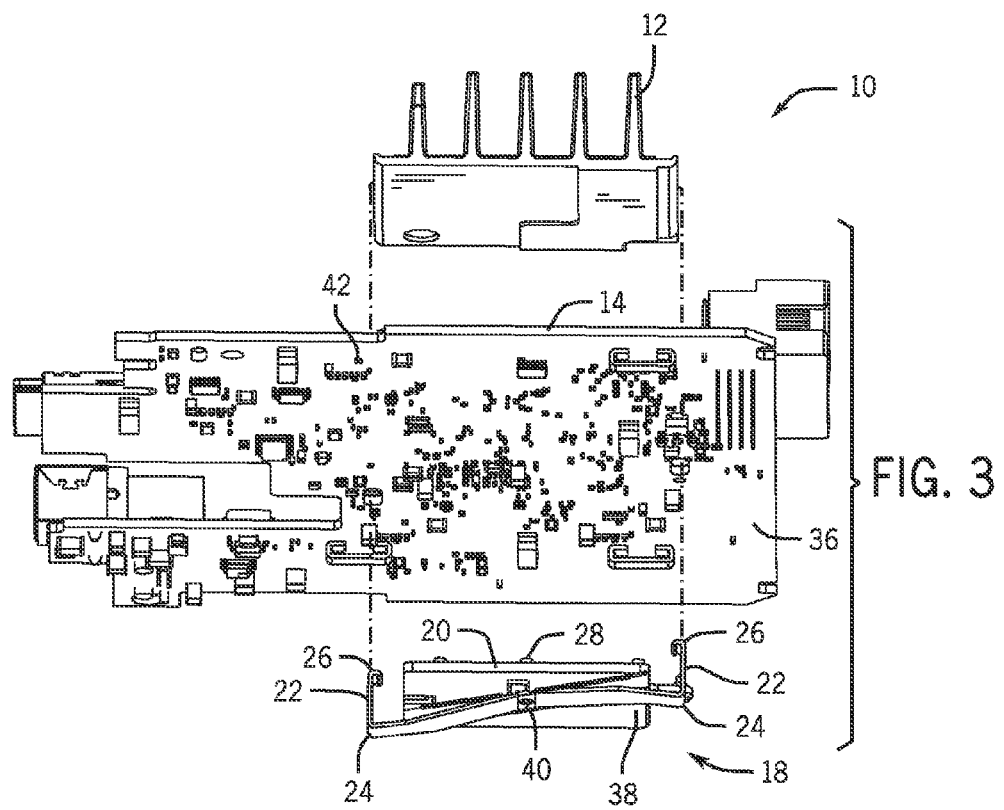
FIG. 3 is an exploded perspective view of a load distributed heat sink system showing a underside of a heat sink, a second side of a circuit board, and a second side of a heat sink clip assembly.

FIGS. 2 and 3 are exploded top and bottom views, respectively, of the heat sink assembly 10 including the heat sink clip assembly 18. In most embodiments, the heat sink clip assembly 18 is used to attach the heat sink 12 to the electronic circuit board 14. FIGS. 2 and 3 also show how the heat sink 12, electronic circuit board 14 and heat sink clip assembly 18 are generally assembled together to form a heat sink assembly 10 and carry out the function of attaching the heat sink 12.

FIG. 3 shows an embodiment of the heat sink clip assembly 18 comprising a load distribution plate 20 and a clip 22. The illustrated embodiment shows the load distribution plate 20 to be of comparable length and width to the heat sink 12, and having a relatively low profile. Generally, the load distribution plate 20 acts as a secondary support which distributes the load applied to the electronic circuit board 14 in order to decrease or eliminate potentially damaging concentrations of stress. The load distribution plate 20 may be made from various materials and can be configured in different shapes and sizes as needed. The clip 22 of the heat sink clip assembly further comprises a set of elbows 24 and a set of hooks 26 at opposing ends. As shown, the clip is generally horizontally attached underneath the load distribution plate 20, extending past the load distribution plate and bent upward at the elbows 24 towards the electronic circuit board 14, and ending with the hooks 26. In some embodiments, the clip 22 comprises a tensile material capable of being deformed with a natural tendency to return to its neutral position.

As illustrated in FIG. 2, the load distribution plate 20 may include a plurality of standoffs 28 attached to a first side 30 of the load distribution plate 20. The standoffs 28 may vary in number and can be molded or otherwise manufactured as one entity with the load distribution plate 20, or they may be attached separately. The standoffs 28 are generally small and short in size, but may take on many configurations. The standoffs 28 may or may not be identical to each other, depending on the configuration of the electronic circuit board 14 and components in the area.

As shown in FIG. 3, there may be slots 32 formed in the electronic circuit board 14 such that the hooks 26 of the clip 22 can be disposed through the slots 32, reaching from one side of one side of the electronic circuit board 14 to the opposing side, as shown with dashed lines. The heat sink 12 is placed on the first side 16 of the electronic circuit board 14 generally on top of a heat-generating component 34, as shown in FIG. 2. When the hooks of the heat sink clip assembly are fully disposed through the slots 32, they may engage the heat sink. The hooks 26 are said to be fully disposed when the load distribution plate 20, which is generally in between the clip 22 and the electronic circuit board 14, makes contact with the electronic circuit board 14. This fully disposed position can be seen in FIG. 4. Thus, the heat sink is secured to the first side 16 of the electronic circuit board 14 via the heat-generating component 34 and the heat sink clip assembly is secured to the second side 36 of the electronic circuit board via the standoffs 28. The heat-generating component 34 mentioned above may be any component that could generally be cooled with a heat sink, including processors, circuit components, switching components, and so forth.

The slots 32 formed through the electronic circuit board 14 may be oblong-shaped as shown in FIG. 2. However, some embodiments may comprise slots 32 of other shapes and sizes. The purpose of the slots 32 is to provide a means for the hooks 26 of the clip 22 to be able to extend through the electronic circuit board 14 and engage the heat sink 12 while the heat sink clip assembly 18 remains on the opposing side of the electronic circuit board 14. Alternatively, some embodiments may not include slots 32 at all. For example, in some embodiments, the clips 22 and/or the heat sink clip assembly 18 may be configured such that the hooks 26 of the clip 22 are disposed around the electronic circuit board 14 and engage the corresponding edges of the heat sink 12, instead of being disposed through the electronic circuit board via slots.

Referring now to FIG. 3, an embodiment of the second side 38 of load distribution plate 20, in which the clip 22 is attached to the load distribution plate 20 at a clip joint 40 is shown. It can also be seen in this embodiment that the second side 36 of the electronic circuit board 14 comprises a plurality of components 42 attached to the surface. Here again, components 42 can be various sorts of electronic components such as resistors, capacitors, amplifiers, multiplexors, and so forth. The standoffs 28 attached to the load distribution plate 20 transfer force from the electronic circuit board 14 to the load distribution plate 20 while avoiding contact with any components 42. The standoffs 28 are strategically mapped on the load distribution plate 20 according to the configuration of components 42 so that no components are present at locations where the standoffs 28 contact the electronic circuit board 14. This way, the load distribution plate 20 is in contact with the electronic circuit board 14 via the standoffs while components 42 populating the region are not disturbed.

Figure 4:
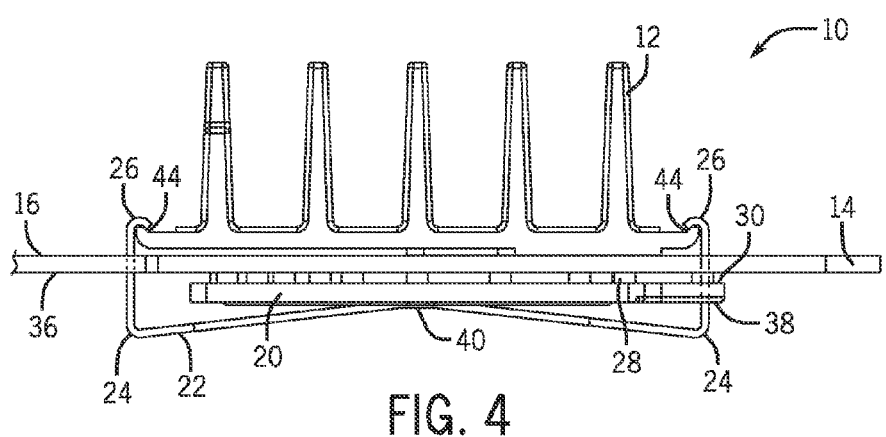
FIG. 4 is a side view of a fully assembled load distributed heat sink system.

FIG. 4 is a side view of one embodiment of the assembled heat sink assembly 10. It can be seen here how the main parts (e.g. heat sink 12, electronic circuit board 14, and heat sink clip assembly 18) of the embodied heat sink assembly 10 interact when fully assembled. As shown, the heat sink clip assembly 18 is in contact with the second side 36 of the electronic circuit board 14 and the heat sink 12 is in contact with the first side 16 of the electronic circuit board 14 such that the edges are aligned with the hooks 26 of the heat sink clip assembly 18. As the hooks 26 engage the heat sink 12, a biasing force caused by the heat sink clip assembly causes the heat sink 12 and the heat sink clip assembly 18 to be mutually stabilized onto respective sides of the electronic circuit board. In the illustrated embodiment, the heat sink includes lipped flanges 44 for the hooks 26 to hook onto. This is one example of several embodiments in which the clip 22 engages the heat sink 12. It can be also seen in FIG. 4 that the clip 22 and heat sink clip assembly 18 of the present embodiment are configured so that the hooks 26 travel through the slots 32 just enough so that a little upward deformation of the clip 22, generally caused by a small pushing force to the elbows 24 of the clip 22, allows the hooks 6 to hook onto the lipped flanges 44 of the heat sink 12. Then, as the clip 22 returns to its neutral position, the spring force of the clip 22 exerts a pulling force on the heat sink onto the first side 16 of the electronic circuit board via the heat-generating component, and a corresponding pushing force on the load distribution plate 20 onto the second side 36 of the electronic circuit board. This increased normal force applied to both the heat sink 12 and the load distribution plate 20 increases the static friction between the heat sink 12 and the heat-generating component 34 as well as between the standoffs 28 of the load distribution plate 20. In some embodiments, this allows the heat sink 12 and the heat sink clip assembly to become attached to the electronic circuit board.

Figure 5:
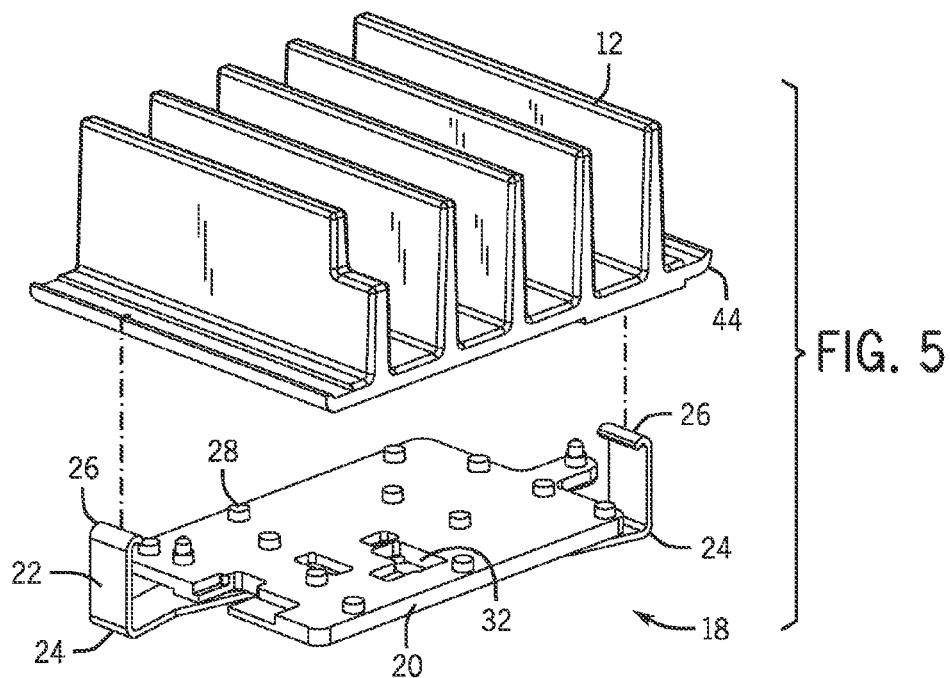
FIG. 5 is a detailed perspective view of a heat sink and a first side of a heat sink clip assembly.
Figure 6:
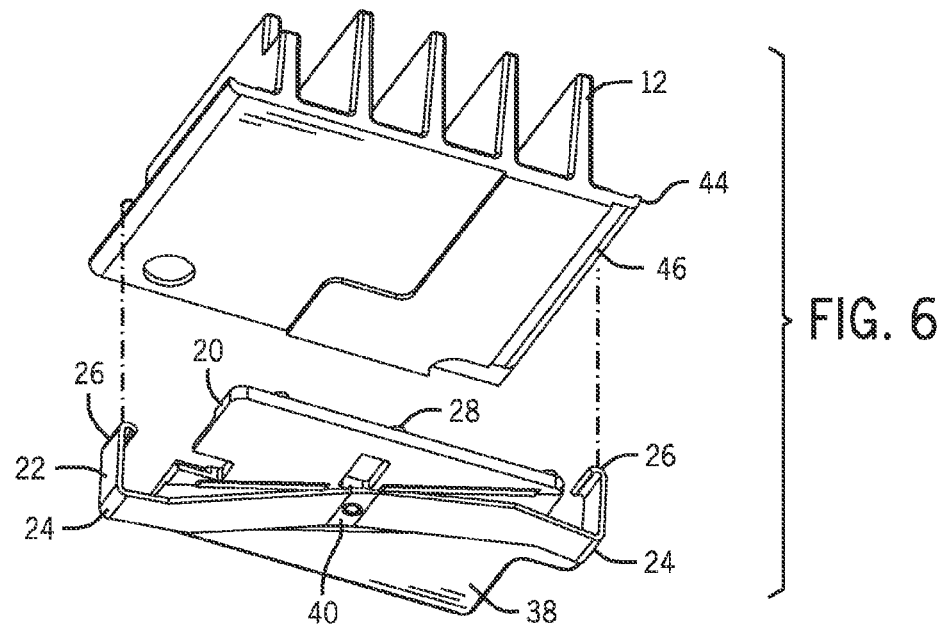
FIG. 6 is a detailed perspective view of a heat sink and a second side of a heat sink clip assembly.

FIGS. 5 and 6 are detailed perspective views of the heat sink 12 and the heat sink clip assembly 18 without the electronic circuit board 14. One skilled in the art will appreciate that each of these elements can be embodied in different ways, including but not limited to the embodiments discussed below.

FIG. 5 shows one embodiment of the heat sink 12, which includes parallel vertically oriented ridges. Some other embodiments may comprise heat sinks 12 with different configurations and various heat dissipating structures, including existing and newly developed configurations. In some embodiments, the heat sink 12 may have general shapes other than a square. As previously mentioned, the edges of the heat sink 12 may comprise lipped flanges 44 for the hooks 26 of the clip 22 to engage with. The illustrated embodiment shows the heat sink 12 as having these lipped flanges 44 on two opposing edges of a four-sided heat sink 12. Other embodiments may have lipped flanges 44 on all sides of a heat sink 12. This may be advantageous as the heat sink 12 may be attached in several orientations. Alternatively, in some embodiments, other hook-receiving elements may replace the lipped flanges 44. Some embodiments may include a recessed portion of an edge, or there may be slots in the heat sink 12 similar to and aligned with the slots 32 in the electronic circuit board 14. Accordingly, some embodiments may forego having hooks 26 at the ends of the clip 22. Instead, some embodiments may employ other engaging mechanisms as a means of stabilizing the heat sink 12 and heat sink clip assembly 18 about the electronic circuit board 14. This may include one-way inserts and corresponding one-way insert receivers integrated into the heat sink 12, with or without release mechanisms. There are numerous ways for the heat sink clip assembly 18 to engage the heat sink 12 so that both the heat sink 12 and the heat sink clip assembly 18 are secured to opposing sides of the electronic circuit board 14 that maintain the essence of the present disclosure.

The illustrated embodiment shows the clip 22 as a separate entity positioned diagonally across the second side 38 of the load distribution plate 20 and heat staked onto the load distribution plate at the clip joint 40. The diagonal orientation of the clip 22 may be advantageous in some embodiments, but the clip 22 may be positioned about the load distribution plate 20 in various ways, including laterally. Furthermore, some embodiments may utilize more than one clip 22 or more than two hooks 26. Some embodiments may comprise two clips positioned perpendicularly to each other such that hooks 26 engage the heat sink 12 at each of the four sides of a four-sided heat sink. Some embodiments may include heat sinks 12 of other shapes as mentioned above, requiring clips 12 of corresponding configurations. Correspondingly, the slots 32 formed in the electronic circuit board 14 may be positioned and configured in various ways to be compatible with the heat sink clip assembly 18 and heat sink 12.

The coupling of the load distribution plate 20 and the clip 22 or clips may be made in a number of ways as well. The clip 12 in the present embodiment comprises outwardly bending elbows 24 that aid in exerting a pulling force on the heat sink 12 when it is engaged with the heat sink 12. The clip 12 may be positioned in other ways, including remaining flush against the load distribution plate 20, having a plurality of clip joints 40, or separated into multiple segments and attached separately with each segment having one hook 26. FIG. 6 shows the clip 12 of the present embodiment as being attached to the second side 38 of the load distribution plate 20. Others ways of situating the clip 12 about the load distribution plate 20 include being molded into the load distribution plate 20 or various other ways of fixing the clip 22 or clips about the load distribution plate 20 or not attached at all.

As the heat sink assembly is in use, the heat sink 12 is generally urged onto the heat-generating component by the heat sink clip assembly. Some embodiments may utilize a thermally conductive agent applied between the heat sink underside 46 and the heat-generating component to further facilitate heat transfer and dissipation through the heat sink 12.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A heat sink system, comprising:
    a circuit board comprising an electronic circuit to be cooled disposed on a first side of the circuit board;
    a heat sink disposed adjacent to the electronic circuit and thermally coupled to the electronic circuit to extract heat from the electronic circuit during operation, wherein the heat sink comprises a flange located near a bottom surface of the heat sink;
    a clip disposed on a second side of the circuit board opposite the first side, the clip contacting the heat sink at the flange to retain the heat sink in place adjacent to the electronic circuit; and
    a load spreader disposed adjacent to the clip, the clip urging the load spreader towards the second side of the circuit board to create a force to retain the heat sink in place adjacent to the electronic circuit, wherein the load spreader comprises:
        a first edge; and
        an opposing edge on an opposing end of the load spreader from the first edge, wherein the clip extends through the circuit board a first location adjacent to the first edge and a second location adjacent to the opposing edge.

2. The system of claim 1, comprising a thermal interface disposed intermediate the electronic circuit and the heat sink.

3. The system of claim 1, wherein the load spreader comprises a plurality of standoffs configured to contact the circuit board and to hold a body of the load spreader spaced from the second side of the circuit board.

4. The system of claim 3, wherein the standoffs are disposed in locations selected to avoid contact with circuit components disposed on the second side of the circuit board.

5. The system of claim 3, wherein the standoffs are molded integrally with the load spreader.

6. The system of claim 1, wherein the load spreader is made of a non-conductive material.

7. The system of claim 6, wherein the load spreader is made of a fiber-reinforced synthetic plastic material.

8. The system of claim 1, wherein the clip comprises a pair of extensions extending from the second side of the circuit board towards the first side of the circuit board and configured to contact the heat sink to retain the heat sink in place adjacent to the electronic circuit.

9. The system of claim 8, wherein the circuit board comprises slots through which the extensions extend.

10. The system of claim 8, wherein the heat sink comprises clip interface regions configured to contact the extensions of the clip.

11. The system of claim 10, wherein the clip comprises two extensions and the heat sink comprises interface regions disposed in symmetrical locations to permit the heat sink to interact with the clip extensions.

12. The system of claim 1, wherein the load spreader comprises a pin for securing the load spreader to the clip.

13. A heat sink system, comprising:
    a heat sink configured to be disposed adjacent to an electronic circuit disposed on a circuit board and configured to be thermally coupled to an electronic circuit to extract heat from the electronic circuit during operation, wherein the heat sink comprises a flange located near a bottom surface of the heat sink;
    a clip configured to be disposed on a second side of the circuit board opposite the first side, the clip being configured to contact the heat sink at the flange to retain the heat sink in place adjacent to the electronic circuit; and a load spreader configured to be disposed adjacent to the clip, wherein when installed, the clip urges the load spreader towards the second side of the circuit board to create a force to retain the heat sink in place adjacent to the electronic circuit, wherein the load spreader comprises:

a first edge; and an opposing edge on an opposing end of the load spreader from the first edge, wherein the clip extends through the circuit board a first location adjacent to the first edge and a second location adjacent to the opposing edge.

14. The system of claim 13, wherein the load spreader comprises a plurality of standoffs configured to contact the circuit board and to hold a body of the load spreader spaced from the second side of the circuit board, wherein the standoffs are disposed in locations selected to avoid contact with circuit components disposed on the second side of the circuit board.

15. The system of claim 13, wherein the clip comprises extensions configure to contact the heat sink, and wherein the heat sink comprises clip interface regions configured to contact the extensions of the clip.

16. The system of claim 15, wherein the clip comprises two extensions and the heat sink comprises interface regions disposed in symmetrical locations to permit the heat sink to interact with the clip extensions.

17. A heat sink system, comprising:

a clip configured to be disposed on a second side of a circuit board opposite from a first side on which a electronic circuit is disposed that is to be cooled, the clip being configured to contact a flange of a heat sink disposed adjacent to the electronic circuit to retain the heat sink in place adjacent to the electronic circuit, wherein the flange is located near a bottom surface of the heat sink; and a load spreader configured to be disposed adjacent to the clip, wherein when installed, the clip urges the load spreader towards the second side of the circuit board to create a force to retain the heat sink in place adjacent to the electronic circuit, wherein the load spreader comprises:

a first edge; and an opposing edge on an opposing end of the load spreader from the first edge, wherein the clip extends through the circuit board a first location adjacent to the first edge and a second location adjacent to the opposing edge.

18. The system of claim 17, wherein the load spreader comprises a plurality of standoffs configured to contact the circuit board and to hold a body of the load spreader spaced from the second side of the circuit board.

19. The system of claim 17, wherein the standoffs are disposed in locations selected to avoid contact with circuit components disposed on the second side of the circuit board.

20. The system of claim 17, wherein the standoffs are molded integrally with the load spreader.

* * * * *